United States Patent
Etherington (12)

(10) Patent No.: US 6,231,743 B1
(45) Date of Patent: May 15, 2001

(54) METHOD FOR FORMING A SEMICONDUCTOR DEVICE

(75) Inventor: Gregory S. Etherington, Cedar Creek, TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/476,811

(22) Filed: Jan. 3, 2000

(51) Int. Cl.$^7$ .............................. C25D 21/12; H01L 21/66
(52) U.S. Cl. .............................. 205/83; 205/84; 205/82; 205/81; 205/96; 438/17
(58) Field of Search ................... 205/82, 83, 84, 205/96, 137, 81, 766; 204/228.1, 228.7, 228.9; 438/17

(56) References Cited

U.S. PATENT DOCUMENTS

| | | | |
|---|---|---|---|
| 2,751,340 | 6/1956 | Schaefer et al. | 205/96 |
| 2,859,166 | 11/1958 | Grigger | 204/279 |
| 3,880,725 | * 4/1975 | Vel Raalte et al. | 205/95 |
| 4,148,707 | 4/1979 | Mayer et al. | 204/297.09 |
| 4,304,641 | 12/1981 | Grandia et al. | 205/96 |
| 4,420,382 | 12/1983 | Riedl | 205/724 |
| 4,421,627 | 12/1983 | LeBaron | 204/297.13 |
| 4,466,864 | * 8/1984 | Bacon et al. | 205/105 |
| 4,678,545 | 7/1987 | Galik | 205/50 |
| 4,720,329 | 1/1988 | Sirbola | 205/143 |
| 4,879,007 | 11/1989 | Wong | 205/137 |
| 4,882,537 | * 11/1989 | Silverman | 324/65 R |
| 5,084,153 | 1/1992 | Mosse et al. | 204/230.3 |
| 5,135,636 | * 8/1992 | Yee et al. | 205/96 |
| 5,149,419 | 9/1992 | Sexton et al. | 205/75 |
| 5,230,743 | 7/1993 | Thompson et al. | 134/32 |
| 5,312,532 | 5/1994 | Andricacos et al. | 204/229.4 |
| 5,332,487 | 7/1994 | Young, Jr. et al. | 205/80 |
| 5,582,708 | 12/1996 | Delfrate et al. | 205/129 |
| 5,620,581 | * 4/1997 | Ang | 205/96 |
| 5,739,692 | * 4/1998 | Subda, Jr. | 324/444 |

FOREIGN PATENT DOCUMENTS

| | | | |
|---|---|---|---|
| 195 47 948 C1 | 12/1996 | (DE) | C25D/5/18 |
| 500 513 A1 | 8/1992 | (EP) | C25D/1/10 |
| 0 666 343 A1 | 8/1995 | (EP) | C25D/17/06 |
| 2 089 838 | 6/1982 | (GB) | C25D/17/08 |
| 1009157 | 11/1998 | (NL) . | |
| WO 87/07654 | 12/1987 | (WO) | C25D/5/02 |

OTHER PUBLICATIONS

F.A. Lowenheim, Electroplating, McGraw Hill Book Co., New york, pp. 152–155, 160–163, 363–377, 1978.*
R.H. Rousselot, "Current–Distribution Improving Aids", Metal Finishing, pp. 57–53, Mar. 1961.*
Database WPI, Section Ch, Week 7946, Derwent Publications Ltd., London, GB; AN 79–83249B, XP002110736 & JP 54 128945 A (Sumitomo Metal Ind Ltd), Oct. 5, 1979 Abstract.
Rousselot, "Current–Distribution Imroving Aids," Metal Finishing, pp. 57–63 (1961).

* cited by examiner

Primary Examiner—Kathryn Gorgos
Assistant Examiner—Michael Feely
(74) Attorney, Agent, or Firm—Robert A. Rodriquez

(57) ABSTRACT

A substrate (155) is placed into a plating bath (19, 59), a current in the bath is measured, and a film (110) is plated onto the substrate (155). In one embodiment the current is measured using a sensing array (57) positioned within the bath, and the measurement is used to control a plating deposition parameter. In an alternative embodiment the current is measured using the sensing array (57) and a characteristic of the plated film is controlled using a corresponding control array (53) also positioned within the plating bath (59).

20 Claims, 4 Drawing Sheets

METHOD FOR FORMING A SEMICONDUCTOR DEVICE

RELATED APPLICATION

The present application is related to U.S. Pat. No. 6,174, 425 entitled "Process for Depositing a Layer of Material Over a Substrate, which is assigned to the assignee hereof and incorporated herein by reference.

FIELD OF THE INVENTION

The present invention relates generally to methods for depositing films on a substrate, and more particularly, to methods for electroplating films on semiconductor device substrates.

BACKGROUND OF THE DESCRIPTION

Plating as a method of forming films on substrates is becoming increasingly common in semiconductor manufacturing. More specifically, electroplating is becoming recognized as a cost-effective method for forming conductive films, such as copper on semiconductor substrates. FIG. 1 includes a cross-sectional view illustrating portions of a plating system 10. The plating system 10 includes a chamber 11, a plating solution 19, a plating solution inlet 111 and a plating solution outlet 113, a cup 12, a ring thief 17, a diffuser 13, an anode 14, a cathode 15, and a substrate 155 coupled to the cathode 15. The cathode 15 additionally includes a turntable assembly 151 and clamps 153. During operation of the of the plating system 10, current flows through the plating solution between the anode 14 (positive electrode) and the cathode 15 (negative electrode), and metal ions in the solution are reduced to metal atoms that deposit onto the substrate 15. At the anode, an oxidation reaction occurs that replenishes the plating solution with metal ions reduced at the cathode.

Currently, no commercially viable methods exist for measuring the plating solution's current density. A pH probe can measure the concentration of ionic species in the plating bath, however, it cannot measure current density. A current measuring probe can manually be manipulated within the plating solution, but this method has disadvantages. First, the probe measures only specific singular locations within the plating solution. These points correspond to only small areas of the substrate. Second, the probe cannot be used when processing production substrates because it interferes with and undesirably impacts the plating deposition process. Therefore, this prior art method is capable of only being used with non-production (dummy) wafers. Finally, because the probe is continually being removed and reintroduced into the bath, particle generation may be of concern. Particles and contaminants introduced by the probe can cause a number of problems that degrade the quality of the plated film.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with an embodiment of the present invention, a surface of a substrate is exposed to a plating bath, a first current flow is measured in a least one first position within the plating bath; and a film is plated onto the substrate. In one embodiment the current flow is measured by flowing plating solution through a sensing unit and measuring a correspondingly produced signal. In one embodiment the sensing unit is formed as part of the plating system's diffuser plate. In one embodiment processing parameters, such as bath flow rate or the bias potential between the plating system's cathode and anode are adjusted in response to the signal measured by the sensing unit to affect a plated film characteristic, such as film thickness and film uniformity. In alternative embodiments, current flow in the plating bath is controlled using a control array within the bath. The control array can then be used to the control the current flow in response to the current measured by the sensing unit.

Figure 2:
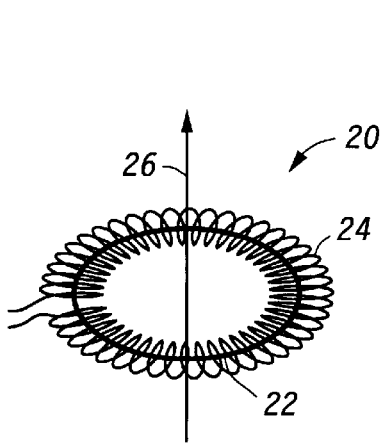
FIGS. 2 and 3 illustrate basic concepts of sensing current through a toroidal coil and a parallel stripline.
Figure 3:
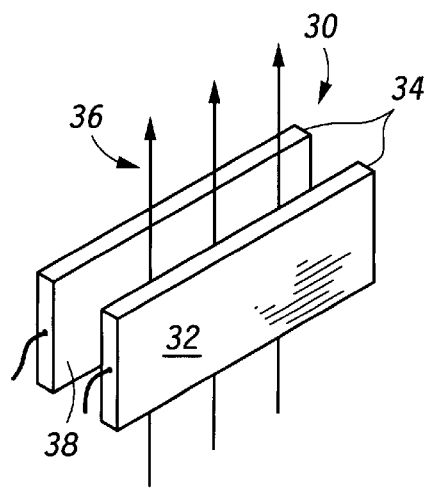

An embodiment of the present invention will now be described more fully with references to the accompanying figures. In accordance with one embodiment, a plating system is configured to sense and/or control current flowing through a plating solution. FIGS. 2 and 3 illustrate examples of embodiments of the present invention. FIG. 2 includes a toroidal coil 20 having a magnetic core 22 and leads 24 wound around the magnetic core 22. As current 26 passes through the toroidal coil 20, a potential can be detected across the leads 24. The potential is proportional to the amount of current in the plating bath passing through the toroidal coil. FIG. 3 includes an alternate embodiment in which parallel striplines 30 are used to sense and/or control the current flowing through the plating solution. The parallel striplines 30 include a first electrode 32 and a second electrode 38. As current 36 passes between the electrodes 32 and 38, a potential 34 is sensed across the electrodes 32 and 38. The potential is proportional to the amount of current 36 flowing between the electrodes. In accordance with embodiments of the present invention, these are non-limiting examples of two types of sensing and/or controlling systems that can be incorporate within a plating system to allow for the sensing and/or control of electrical current flowing between the anode and cathode. In alternative embodiments, any type of appropriate current sensing/controlling electrodes or apparatus can be used.

Figure 1:
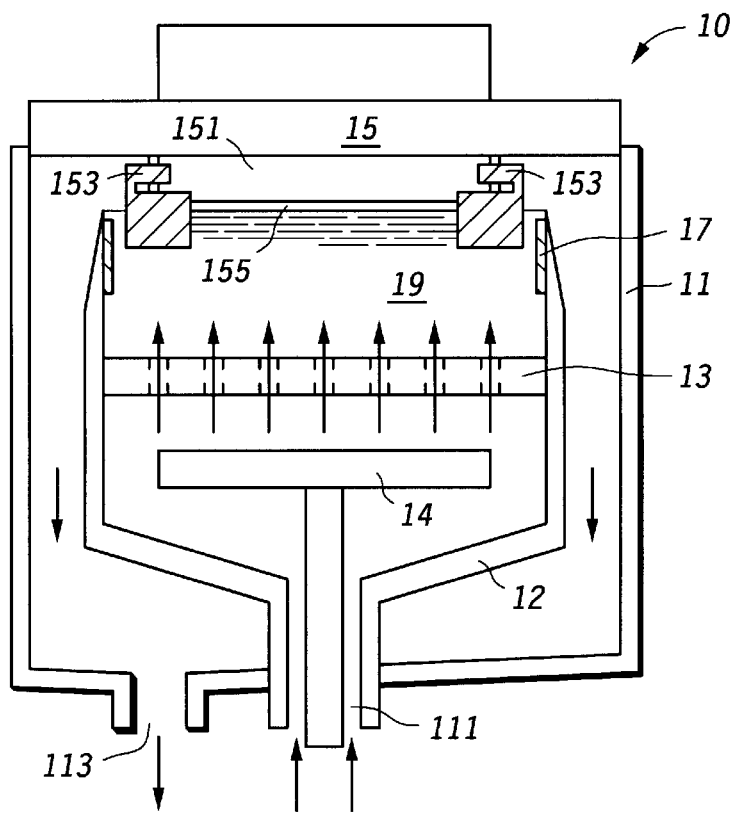
FIG. 1 includes an illustration of a cross-sectional view of a prior art plating system.
Figure 4:
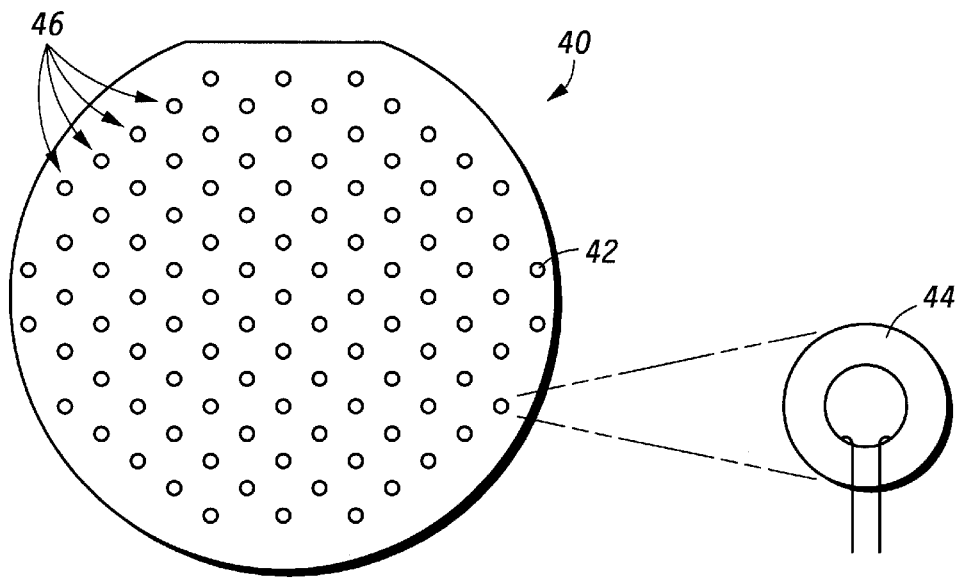
FIG. 4 includes a plan view of a diffuser that includes toroidal coils.

In one particular embodiment, the diffuser plate 13, in FIG. 1 can be replaced by a diffuser plate 40 as illustrated in FIG. 4. In accordance with one embodiment, the diffuser plate 40 includes a number of openings 42 and a plurality of toroidal coils 44. If the toroidal coils 44 are used for sensing current flow between the anode and the cathode, the toroidal coils 44 can be positioned to form an array 46 across the surface of the diffuser plate 40. The array 46 can then be oriented to the primary surface of the substrate 155. In this manner, the array 46 can sample current density at a variety of locations that correspond to areas of the substrate 155.

Alternatively, the toroidal coils 44 can be positioned within the diffuser plate such that they are used to form the openings 42. In accordance with one embodiment, the toroidal coils 44 and their corresponding leads are contained within an inert material that does not react with the plating solution. The leads are then routed along or within portions of the diffuser plate 40 to a point or points where electrical connections can be made for measuring coil potentials.

In addition to sensing the current density, the diffuser plate can alternatively include toroidal coils, parallel striplines, etc. that can be used to control the amount of current density passing through the diffuser plate 40. In this embodiment, a counter potential or current flow could be applied to the leads of the toroidal coil, parallel striplines, etc. to control, (increase, decrease or maintain) an amount of current flowing through any one of the respective toroidal coils, parallel striplines, etc. For example, this could possibly be accomplished by applying a voltage potential to the windings (leads) of the toroidal coil, thereby generating an electrical field within the coil that can impede electrical current flow and ultimately the plating deposition rate. By selectively controlling the applied voltage or current through specific toroidal coils in the control array in response to the sensing array, the amount of plating bath electrical current allowed through any given coil or series of coils can be controlled to alter the uniformity of the current density at the cathode and the deposition of plated material on the substrate.

Figure 5:
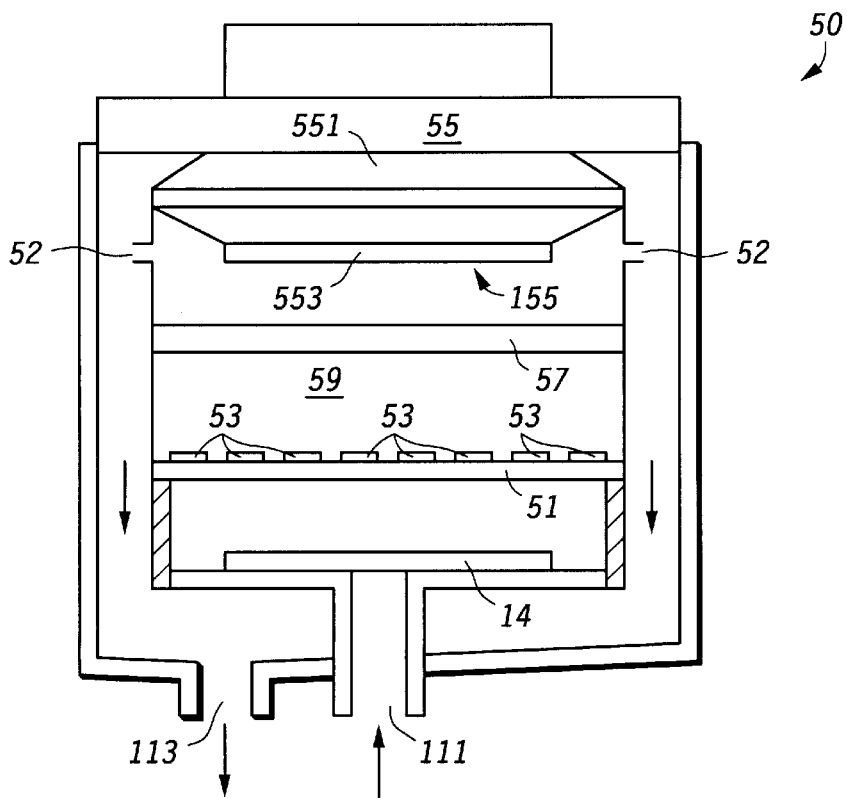
FIG. 5 includes an illustration of a cross-sectional view of an alternative embodiment that includes a sensing array and a control array.

FIG. 5 includes an alternative embodiment of the present invention, in which the diffuser plate 51 includes a control array 53 disposed on (or within) the diffuser plate 51 and a sensing array 57 is positioned between the control array 53 and the cathode 55. In alternative embodiments, instead of the control array being positioned between the sensing array and the cathode, sensing array may be positioned between the control array and the cathode (not shown). The configuration of the plating system 50 differs from the plating system shown in FIG. 1 to illustrate that embodiments herein can be incorporated into a variety of plating systems. The plating system of FIG. 5 additionally includes plating solution outlets 52, and the cathode 55 is configured differently from the cathode 15 shown in FIG. 1. In this particular embodiment, the turntable 551 includes a ring shaped clamp 553 that secures the substrate 155 to the turntable. Alternatively, other plating system configurations including those that do not have turntables can be used to deposit films using embodiments of the present invention.

Figure 6:
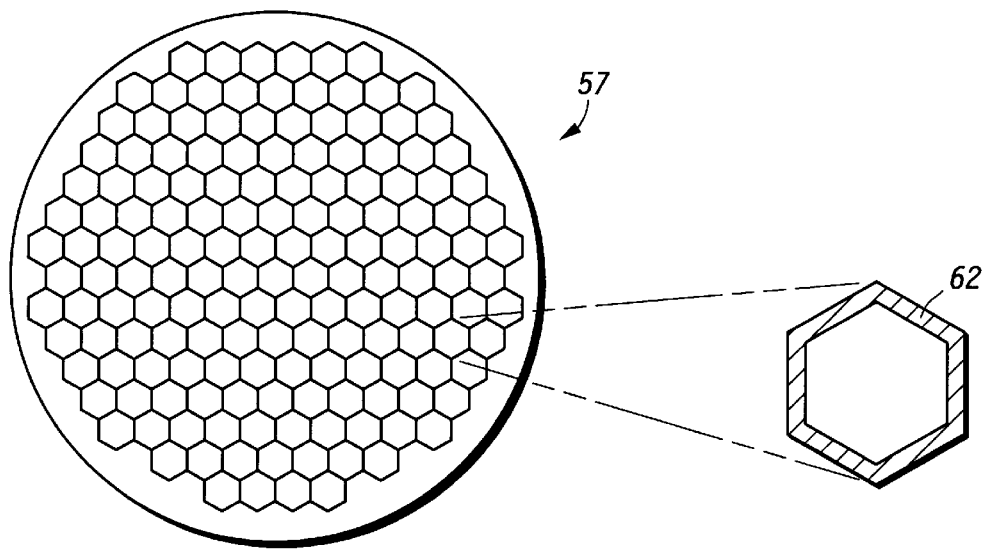
FIG. 6 includes a plan view of the sensing array showing a honeycomb configuration of toroidal coils.

In accordance with one embodiment, the sensing array 57 (or control array 53) of FIG. 5 can be configured to include a matrix of toroidal coils, similar to that illustrated in FIG. 6. In accordance with this embodiment, the toroidal coils 62 are hexagonal shaped and disposed within the sensing array (or diffuser plate 51). In this particular embodiment, the toroidal coils are isolated from each other by a matrix of insulating material. The combination of the coils and the insulating materials form a honeycomb-like matrix. Although illustrated in FIG. 6 as a hexagon, other shapes including circular, square, octagonal, etc. may be used.

Both the control array 53 and the sensing array 57 can include substantially rigid members that hold their respective coils in relatively fixed positions. In accordance with one embodiment, control array 53 is mounted on or within a porous ceramic diffuser plate 51. The diffuser plate 51, unlike the diffuser plate 40, has no holes extending through the entire thickness of the diffuser plate. Similarly, the sensing array 57 can be disposed within or mounted on a relatively-rigid inert material such polyurethane or the like. In yet an alternative embodiment, the sensing array may be attached, but not electrically connected to the cathode 55. Accordingly, the positional relationship between the sensing array and the substrate is then fixed, though the sensing array can rotate with the turntable.

Figure 7:
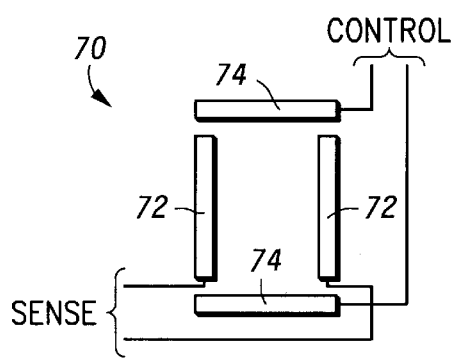
FIGS. 7–9 include illustrations of parallel striplines in different configurations.
Figure 8:
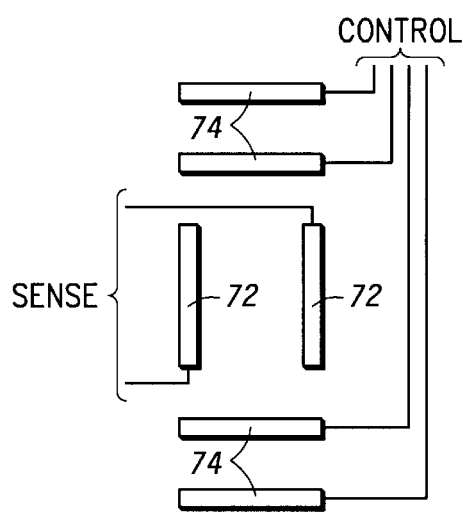
Figure 9:
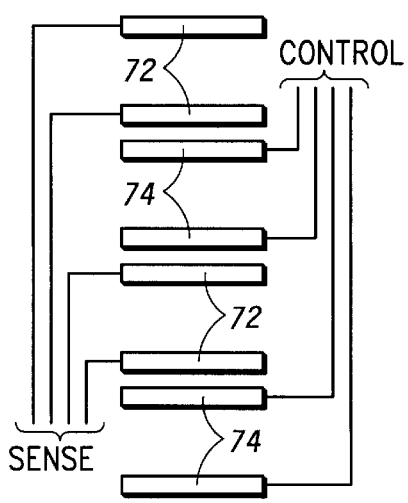

FIGS. 7–9 illustrate alternative embodiments, which include parallel strip line sensing units. In FIG. 7, four strip lines are disposed along four edges of an opening within a diffuser plate or other support member (not shown) to form a sensing assembly 70. In accordance with this embodiment, the sensing assembly 70 includes two parallel sensing electrodes 72 and two parallel control electrodes 74. The two sensing electrodes 72 are parallel to each other and perpendicular to the two control electrodes 74. FIG. 8 illustrates a similar configuration, however the sensing electrodes 72 are separated from the control electrodes 74. In FIG. 9, each of the parallel electrodes (sensing and control) are oriented such that they are parallel to each other. The control and sensing electrodes are typically incased within an inert material such as polyethylene, polypropylene, polyvinyl chloride, a fluorocarbon such as Teflon™, silicone, or the like. The inert incasing reduces the likelihood of contaminating the plating solution and plating material from the solution onto the coils or electrodes.

Figure 10:
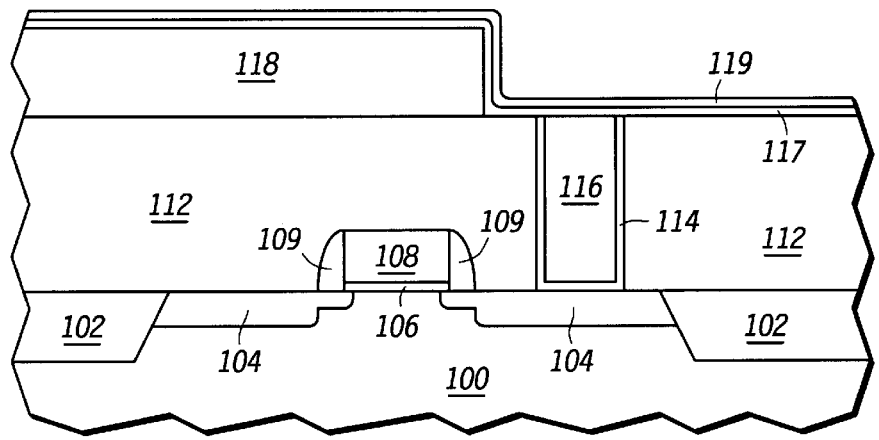
FIGS. 10–12 include illustrations of cross-sectional views of a semiconductor device substrate during processing steps used to form a substantially completed device.

In accordance, with embodiments of the present invention, the equipment configuration previously described can be used to form layers on substrates in the fabrication electronic components. FIG. 10 includes an illustration of cross-sectional view of a semiconductor device substrate 100. As used in this specification, the semiconductor device substrate 100 is a monocrystalline semiconductor wafer, a semiconductor-on-insulator wafer, or any other substrate use for forming semiconductor devices. Field isolation regions 102 and doped regions 104 are formed within the substrate 100. A gate dielectric layer 106 and a gate electrode 108 overlie portions of the substrate 100 and the doped regions 104. Sidewall spacers 109 lie along opposite sidewalls of the gate electrode 108. A first interlevel dielectric (ILD) layer 112 is formed over the gate electrode 108, field isolation regions 102, and doped regions 104. An opening is formed within the ILD layer 112 to expose a portion of one of the doped regions 104, as illustrated in FIG. 10. The opening is then filled with a barrier film 114 and a conductive fill material 116 to form a conductive plug.

A second ILD layer 118 is then formed over the first ILD layer 112 and the conductive plug. The second ILD layer 118 is patterned to form openings where subsequent interconnects will be formed. After the opening has been formed, a barrier film 117 and a conductive seed film 119 are formed. Typically, the barrier film 117 is formed of a refractory metal or refractory metal nitride such as tantalum, tantalum nitride, molybdenum, molybdenum nitride, titanium, titanium nitride, and the like. The conductive seed film 119 is typically formed using materials similar to those that will subsequently be plated onto exposed substrate surfaces. In this particular embodiment, copper is plated over the exposed substrate surface, and therefore, the seed film 119 includes copper. In alternate embodiments, the barrier film 117 and the seed film 119 can vary in their composition depending on the type of material being plated and the specific requirements of the structure being formed.

Figure 11:
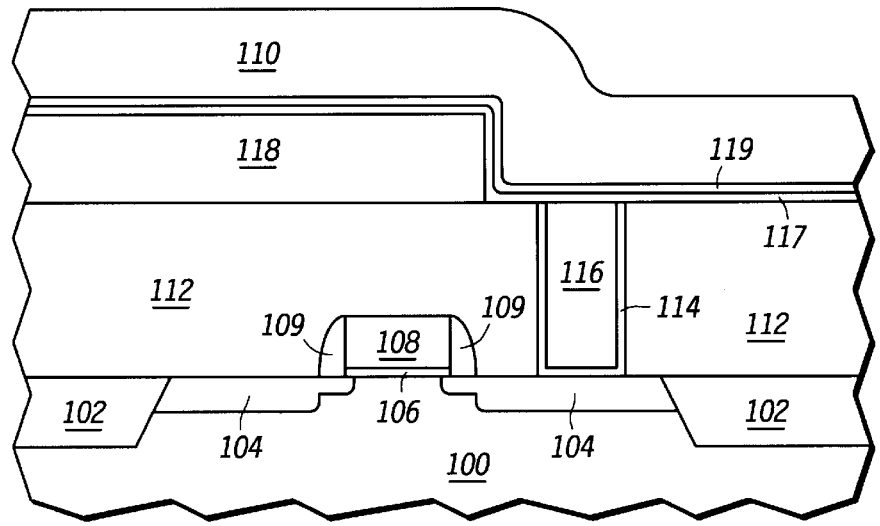

A copper film 110 is then deposited over the conductive seed film 119, as illustrated in FIG. 11. The copper film 110 typically is deposited to completely fill the opening formed in the second ILD 118. The copper film 110 is plated onto the wafer using any one of the using a plating system configured with plating sensing and/or control units described previously, or variants thereof.

During the plating operation, the anode provides a source of plating material onto the seed film 119. If other materials in addition to or other than copper are used to form the plated material, the anode could additionally include those materials. Alternatively, in other embodiments, the appropriate plating materials may be supplied via the circulation loop to replenish the plating solution.

Turning now to the apparatus illustrated in FIG. 5, a control loop can be formed in which the sensing array 57 maps the current density at various locations in the solution and then provides feedback to the control array 53 to control current density at the corresponding locations. If the map produced by the sensing array detects that current density is too high or too low relative to other areas, the respective toroidal coils, parallel striplines, etc. in the control array can be adjusted to increase or decrease the current density in those areas. In this way, the current density uniformity relative to the substrate surface and the corresponding plated film's deposition thickness or uniformity is controlled and improved over that of prior art plating systems. In accordance with one embodiment, the sensing array continuously measures current during plating onto the substrate. Alternatively, the sensing array can measure samples of the current intermittently during plating the film onto the substrate. Similarly, the control array can be configured to respond to the continuous measurements provided by the sensing array (i.e. controlling a current during plating a film onto s substrate varies over time), or in response to the periodic samples measured by the sensing array.

In an alternative embodiment, the sensing and control arrays can sense and control current density in response to a rotating turntable and substrate. For example, in one particular embodiment, if the thickness of the seed layer 119 varies across the substrate, the plating rate in regions of the substrate where the seed layer 1 19 is thinner may be lower because of the increased resistance at the substrate surface. As the substrate is rotated, the control array's toroidal coils, parallel striplines, electrodes, etc. can be activated to correspond with high resistance areas such that the plating rate increases in areas where the seed layer 119 is thinner and decreases in areas where the seed layer is thicker. In this manner, the control array and sensing array are stationary relative to the rotation of the substrate. They respond to the rotation of the substrate by synchronizing increases and decreases in current density with corresponding changes in the substrate's film thickness. In yet other embodiments, it may be desired to plate more material at one location even if the thickness becomes nonuniform. For example, to minimize center-to-edge nonuniformity effects it may be advantageous to selectively apply power to control the toroidal coils, parallel striplines, electrodes, etc. at the edge (or center) of the substrate, thereby reducing the amount of current flow and the corresponding deposition rate at the edge (or center) of the substrate.

Alternatively, the control array can be mechanically operated as opposed to electrically operated. For example, if the sensing array is sensing too much plating at one portion of the substrate, a mechanical device can be used to reduce the amount of plating solution flowing through that portion of the cup. In this particular manner, the flux of ions reaching that portion of the substrate surface is reduced, which in turn reduces the plating rate. In accordance with embodiments of the present invention, both mechanical and electrical configurations can be used to control the plating film thickness and uniformity.

Figure 12:
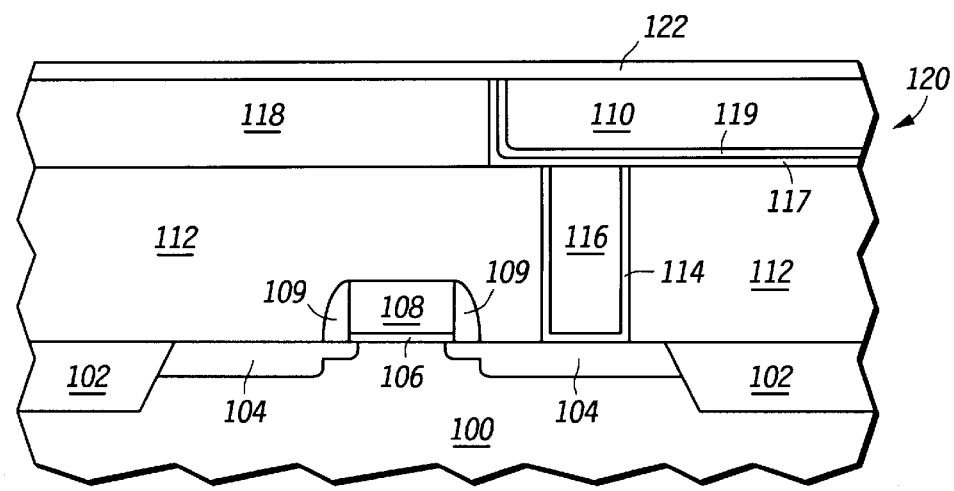

Shown in FIG. 12 is a cross section of a substantially completed semiconductor device. In accordance with one embodiment, portions of the copper film 110, the conductive seed film 119, and the barrier film 117 not contained within the opening within the ILD 118 have been removed using conventional chemical mechanical planarization (CMP) processes to form an interconnect 122. Although illustrated as a single inlaid interconnect, interconnect 122 could alternatively be formed using dual inlaid interconnect processing methodologies. Overlying the interconnect 122 is a capping layer 120. Typically the capping layer 120 is formed using a silicon nitride containing material. Alternatively, the capping material can be formed using any material that adequately adheres to the copper interconnect and provides copper-diffusion barrier protection of adjacent layers. Overlying the capping layer 120 are a passivation and polyimide layers (not shown). Typically, the passivation and polyimide layers are the uppermost layers of a semiconductor device. In accordance with other embodiments, additional interconnect structures and dielectric layers may be formed in order to fabricate a more complicated semiconductor device.

The embodiments described herein can additionally be used for problem detection, which can be particularly useful in preventing misprocesses and equipment damage. For example, the sensing array can be positioned parallel with and in close to the substrate surface (plating surface) to detect whether or not the substrate surface is planar with the plating solution. Ordinarily, the substrate surface is positioned such that it is submersed in and substantially planer with uppermost surface of the plating solution. This is important because it allows the plating surface to contact the plating solution without substantially exposing the substrate's backside to the plating solution and undesirably plating it. Additionally, if portions of the substrate' surface, intended to be plated, do not continuously contact the plating solution during the plating operation material can deplate from these regions of the substrate. The unintentional deplating of the substrate complicates the plating operation because it can result in particles being generated in the bath and non-uniformity of the plated film. Therefore, by positioning the sensing array in close proximity to the substrate, it can detect when portions of the substrate surface do not contact the plating solution. In addition, the sensing array can be used to detect the presence of air bubbles that can collect at the surface of the substrate. The air bubbles are problematic because they prevent plating in regions where the air bubbles are located.

In yet another embodiment, the sensing array can be used as an end point detection apparatus for cleaning internal system components. For example, referring now to FIG. 1, after several substrates have been plated using the plating system 10, plating material invariably deposits onto the clamping structures 153. Periodically, this plating material requires removal. Therefore, in accordance with one embodiment, the clamping structures 153 can be cleaned by deplating material off of the clamping structures 153 and onto the ring thief 17 or other baisable chamber component. The deplating continues until all of the plated material is removed from the clamping structures 153. When this occurs the corresponding plating bath current flow, as sensed by the sensing array, measures approximately zero (noise level). When the noise level is reached all or nearly all of the plated material on clamping structure 153 has been removed. After the plated material has been removed, plating of substrates can again resume using the cleaned clamping structures 153.

Although many of the embodiments previously described have been directed towards semiconductor devices, the embodiments disclosed herein can be used for a variety of other substrate types including printed circuit boards or the like. In addition, alloys and magnetic materials may also be plated using the embodiments of the present invention. Furthermore, although embodiments described herein discuss copper plating, other materials including nickel, platinum, platinum, chrome, or the like can be used for plating purposes. In addition, for embodiments described herein that use the toroidal coil configuration, the diameter of the coil core is typically approximately 3 mm. However, as the technology evolves, one of ordinary skill in the art recognizes that smaller toroidal coils may be used. Furthermore, although embodiments described herein refer to toroidal coils and parallel striplines for measuring current density, one of ordinary skill in the art recognizes that they are illustrative of types of devices that can be used to sense and/or control current flowing through a plating solution. They are, therefore, not intended to be limiting examples for embodiments of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for depositing a film comprising:

exposing a surface of a substrate to a plating bath;

measuring a first current flow in at least one first position apart from a cathode an anode, and the substrate within the plating bath; and plating a film onto the substrate, wherein the cathode, the anode, and the substrate are independent elements.

2. The method of claim 1, wherein measuring a current flow in at least one position within the plating bath further includes:

flowing a plating solution from the plating bath through a sensing unit; and measuring a signal produced by flowing the plating solution from the plating bath through the sensing unit.

3. The method of claim 2, wherein the sensing unit includes part of a diffuser plate within the plating bath.

4. The method of claim 2, further comprising adjusting a processing parameter of plating the film onto the substrate in response to measuring a signal to affect a characteristic of a corresponding plated film on the substrate.

5. The method of claim 4, wherein the processing parameter includes a variable selected from a group consisting of bath flow rate and a bias potential between the cathode and the anode.

6. The method of claim 4, wherein the characteristic of the corresponding plated film includes a film characteristic selected from a group consisting of plated film thickness and plated film uniformity.

7. The method of claim 1 further comprising controlling a second current flow in at least one second position within the plating bath in response to measuring a first current flow in at least one first position within the plating bath to affect a characteristic of a plated film on the substrate.

8. The method of claim 7, wherein the at least one first position is apart from the at least one second position.

9. The method of claim 7, wherein the at least one first position is between the at least one second position and the cathode.

10. The method of claim 7, wherein the at least one second position is between the at least one first position and a the cathode.

11. A method for depositing a film comprising:

placing a substrate into a plating bath;

sampling a current in the plating bath, wherein sampling the current occurs at a position apart from and between a cathode and an anode associated with the plating bath; and plating a film onto the substrate, wherein the cathode, the anode, and the substrate are independent elements.

12. The method of claim 11, wherein sampling is accomplished via a sensing array in the plating bath.

13. The method of claim 12, wherein the sensing array is part of a diffuser plate in the plating bath.

14. The method of claim 12, wherein the sensing array is encased within an inert material.

15. The method of claim 12, wherein the sensing array consists of a plurality of sensors selected from the group consisting of toroidal coils and parallel striplines.

16. The method of claim 11, wherein plating a film onto the substrate forms a portion of an electronic component.

17. The method of claim 11 further comprising controlling a plating parameter in response to sampling a current in the plating bath to affect a characteristic of plating a film onto the substrate.

18. The method of claim 17 further comprising controlling a current in a current controlling array in the plating bath between the anode and the cathode to affect a characteristic of plating a film onto the substrate in response to sampling a current in the plating bath.

19. The method of claim 18, wherein controlling a current during plating a film onto a substrate varies over time.

20. The method of claim 11, wherein sampling occurs intermittently during plating the film onto the substrate.

* * * * *